(12) United States Patent
Imoto et al.

(10) Patent No.: US 11,410,895 B2
(45) Date of Patent: Aug. 9, 2022

(54) WIRING BOARD

(71) Applicant: NGK SPARK PLUG CO., LTD., Nagoya (JP)

(72) Inventors: Yosuke Imoto, Nagoya (JP); Shinichiro Haneishi, Nagoya (JP); Kenji Suzuki, Nagoya (JP); Norihiko Kawai, Nagoya (JP); Naoki Kito, Nagoya (JP)

(73) Assignee: NGK SPARK PLUG CO., LTD., Nagoya (JP)

( * ) Notice: Subject to any disclaimer, the term of this patent is extended or adjusted under 35 U.S.C. 154(b) by 218 days.

(21) Appl. No.: 16/584,074

(22) Filed: Sep. 26, 2019

(65) Prior Publication Data
US 2020/0111716 A1    Apr. 9, 2020

(30) Foreign Application Priority Data

Oct. 5, 2018    (JP) .............................. JP2018-190122
Aug. 23, 2019    (JP) .............................. JP2019-152452

(51) Int. Cl.
| | |
|---|---|
| *H01L 23/13* | (2006.01) |
| *H01L 23/367* | (2006.01) |
| *H01L 23/492* | (2006.01) |
| *H01L 23/15* | (2006.01) |

(52) U.S. Cl.
CPC .............. *H01L 23/13* (2013.01); *H01L 23/15* (2013.01); *H01L 23/367* (2013.01); *H01L 23/4924* (2013.01)

(58) Field of Classification Search
CPC ....... H01L 23/13; H01L 23/15; H01L 23/367; H01L 23/4924; H01L 23/34; H01L 23/36; H01L 23/3675; H01L 23/495; H01L 23/49503; H01L 23/4951; H01L 23/49541; H01L 23/49548
See application file for complete search history.

(56) References Cited

U.S. PATENT DOCUMENTS

2018/0286771 A1*   10/2018   Oya ...................... H01L 23/053

FOREIGN PATENT DOCUMENTS

| JP | 5452345 B2 | 3/2014 |
| JP | 2015-204426 A | 11/2015 |

OTHER PUBLICATIONS

Yosuke Imoto, et al., U.S. Appl. No. 16/583,959 for Wiring Board, filed Sep. 26, 2019.

* cited by examiner

*Primary Examiner* — Sue A Purvis
*Assistant Examiner* — Scott Stowe
(74) *Attorney, Agent, or Firm* — Stites & Harbison, PLLC; Jeffrey A. Haeberlin; James R. Hayne

(57) ABSTRACT

A wiring board has a metal-made base having a front surface and a back surface, an insulating frame body bonded to the front surface of the base through a bonding layer made of bonding material, a seating provided in an area that is located at an inner side with respect to the frame body on the front surface of the base, a mounting area where a component is supposed to be mounted on the front surface of the base, and a groove formed on the front surface of the base. The groove is arranged in at least an area between the mounting area and the seating on the front surface in plan view, and extends in a direction crossing an opposing direction of the mounting area and the seating.

9 Claims, 3 Drawing Sheets

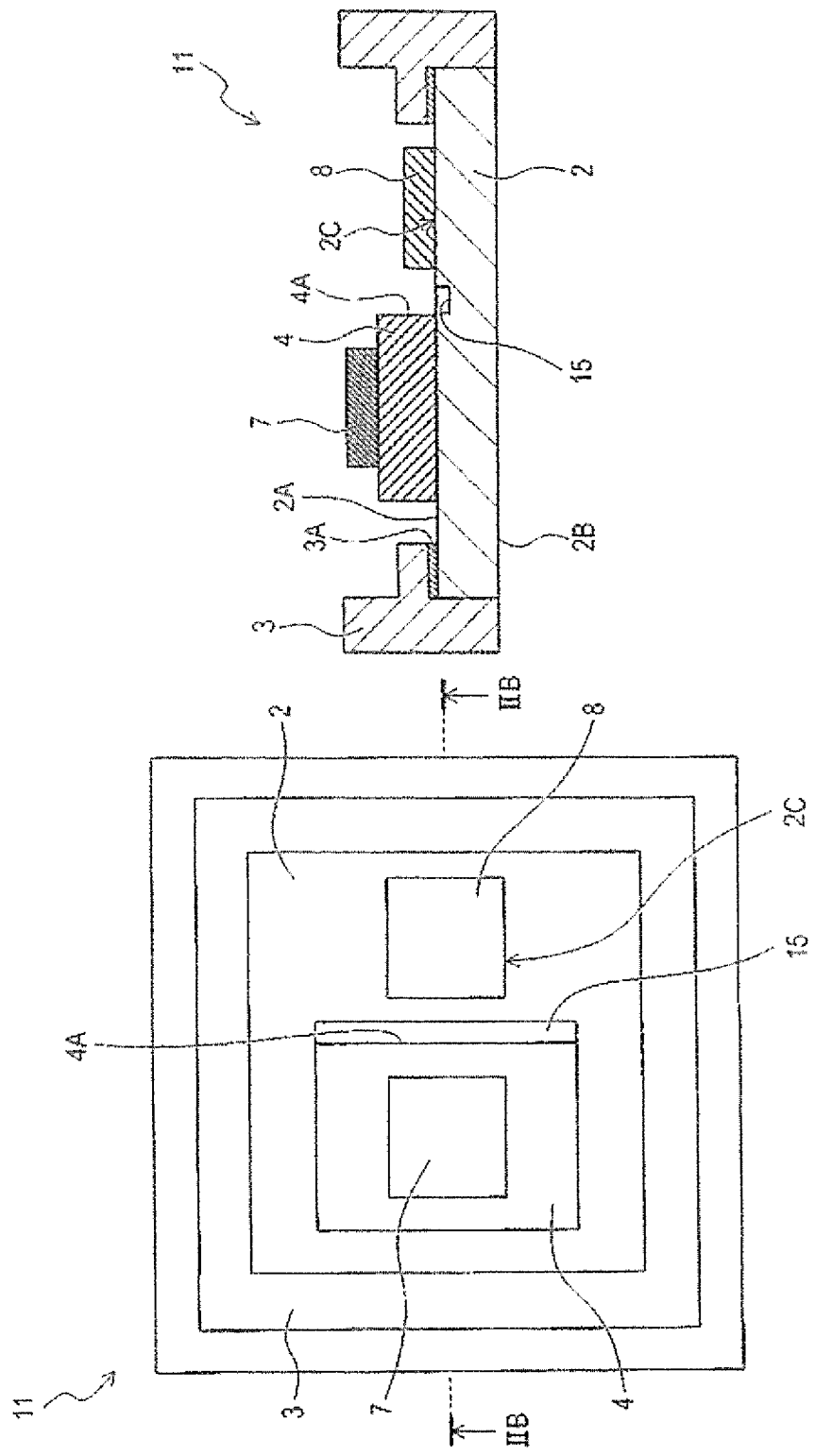

WIRING BOARD

BACKGROUND OF THE INVENTION

The present disclosure relates to a wiring board.

Japanese Unexamined Patent Application Publication No. 2015-204426 (hereinafter is referred to as "JP2015-204426") discloses a wiring board. In JP2015-204426, in order to enhance a heat radiation performance of a component, such as a semiconductor device, mounted on the board, a metal-made base is fixed to a frame body. More specifically, the base is bonded to the frame body through a bonding material such as a brazing material. In JP2015-204426, by providing a stepped portion at the frame body, flow of the bonding material to a mounting area where the component such as an electronic component is supposed to be mounted is suppressed.

SUMMARY OF THE INVENTION

In a configuration that suppresses the flow of the bonding material by the stepped portion provided at the frame body in JP2015-204426, however, a bonding area between the base and the frame body becomes small due to the stepped portion. As a result, there is a possibility that airtightness of a bonding portion will be deteriorated.

Further, as shown in FIG. 4, a base 102 could be provided with a pedestal (or a seating) 104 to mount a plurality of components 107 and 108 in three dimensions, besides a frame body 103. In the case where such a seating 104 is provided, when bonding the frame body 103 and the base 102 together, there is a tendency for the molten bonding material to flow to a root portion 104A, which connects to the base 102, of the seating 104. Then, the bonding material hardens at the root portion 104A, and a fillet F is formed at the root portion 104A. The component (in FIG. 4, the component 108) is normally mounted on a front surface of the base 102 while being aligned with the seating 104. However, if the fillet F reaches a mounting area where the component 108 is supposed to be mounted, when the component 108 is mounted on the front surface of the base 102, this fillet F causes inadequate bonding of the component 108 to the base 102, and also results in the component 108 slanting which causes poor mount of the component 108. The poor mount of the component 108 consequently leads to decrease in bonding strength of the component 108, in the heat radiation performance of the component 108 and in accuracy of a mounting position of the component 108.

An object of the present disclosure is therefore to provide a wiring board that is capable of avoiding the fillet being formed at the root portion of the seating while maintaining or securing the bonding area between the base and the frame body.

According to one aspect of the present disclosure, a wiring board comprises: a metal-made base having a front surface and a back surface; an insulating frame body bonded to the front surface of the base through a bonding layer made of bonding material; a seating provided in an area that is located at an inner side with respect to the frame body on the front surface of the base; a mounting area provided on the front surface of the base, a component being supposed to be mounted on the mounting area; and a groove formed on the front surface of the base, the groove arranged in at least an area between the mounting area and the seating on the front surface in plan view and extending in a direction crossing an opposing direction of the mounting area and the seating.

According to the above configuration of the wiring board, when bonding the frame body to the base, the bonding material forming the bonding layer flows into the groove provided in the area between the mounting area and the seating, thereby avoiding a fillet being formed at a root portion of the seating. It is therefore possible to suppress the forming of the fillet at the root portion of the seating without decreasing a bonding area between the base 2 and the frame body.

In the above wiring board, the groove could be formed while being contiguous to an outer edge, which faces the mounting area, of the seating in plan view. According to the above configuration of the wiring board, since the groove is provided at the root portion of the seating which is a factor in the forming of the fillet, it is possible to surely avoid the fillet being formed. Further, an area where the fillet could be formed due to flow of the bonding material can be decreased at the root portion of the seating.

In the above wiring board, the seating could be formed integrally with the base.

According to the above configuration of the wiring board, it is possible to easily form the seating. Further, since heat can flow from the seating to the base without being interfered, it is possible to enhance the heat radiation performance of the component mounted on the seating.

In the above wiring board, at least one end portion of the groove could protrude toward the frame body with respect to one end of the mounting area in a direction perpendicular to the opposing direction in plan view. According to the above configuration of the wiring board, since the one end portion of the groove is located close to a bonding part between the base and the frame body with respect to the mounting area, the bonding material can be readily guided to or flow into the groove. It is thus possible to surely avoid the bonding material reaching the root portion of the seating.

In the above wiring board, a depth of the groove could be half of a thickness of the base or less. According to the above configuration of the wiring board, it is possible to suppress decrease in heat radiation performance of the base. Further, it is possible to suppress decrease in strength of the base.

In the above wiring board, a width of a part, which overlaps the mounting area, of the groove could be one third of a length of the mounting area in the opposing direction or less.

According to the above configuration of the wiring board, it is possible to avoid the fillet being formed while sufficiently securing a size of the mounting area without decreasing a bonding performance of the component to the base. Further, when the component is mounted on the base, a heat radiation performance of the component can be maintained.

In the above wiring board, the frame body could be principally made of ceramic. This can obtain a semiconductor package having high heat resistance.

In the above wiring board, the base could be made of at least one of copper, copper alloy and copper complex. This can increase a heat transfer performance of the base.

The above wiring board could further comprise the component mounted on the mounting area. This can obtain a semiconductor package having high reliability.

The other objects and features of this invention will become understood from the following description with reference to the accompanying drawings.

BRIEF DESCRIPTION OF THE DRAWINGS

FIG. 2 is a schematic plan view of the wiring board according to a second embodiment of the present invention. FIG. 2B is a schematic sectional view taken along a line IIB-IIB of FIG. 2A.

DETAILED DESCRIPTION OF THE INVENTION

Embodiments of the present invention will be explained below with reference to the drawings.

1. First Embodiment

1-1. Configuration

Figure 1B:
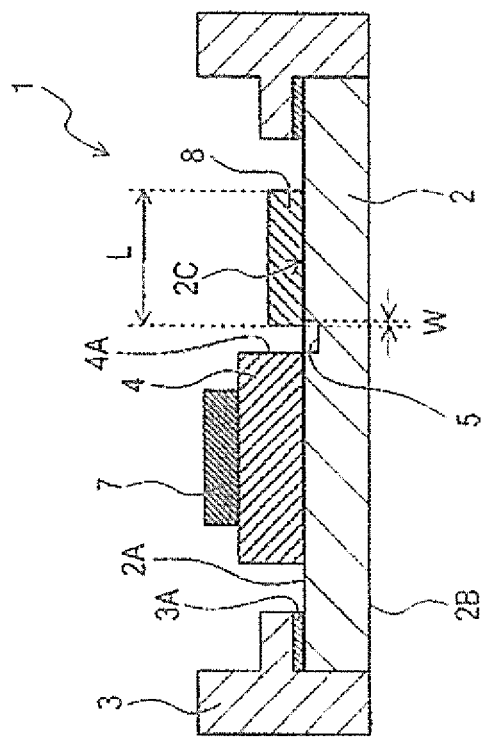
FIG. 1B is a schematic sectional view taken along a line IB-IB of FIG. 1A.
Figure 1A:
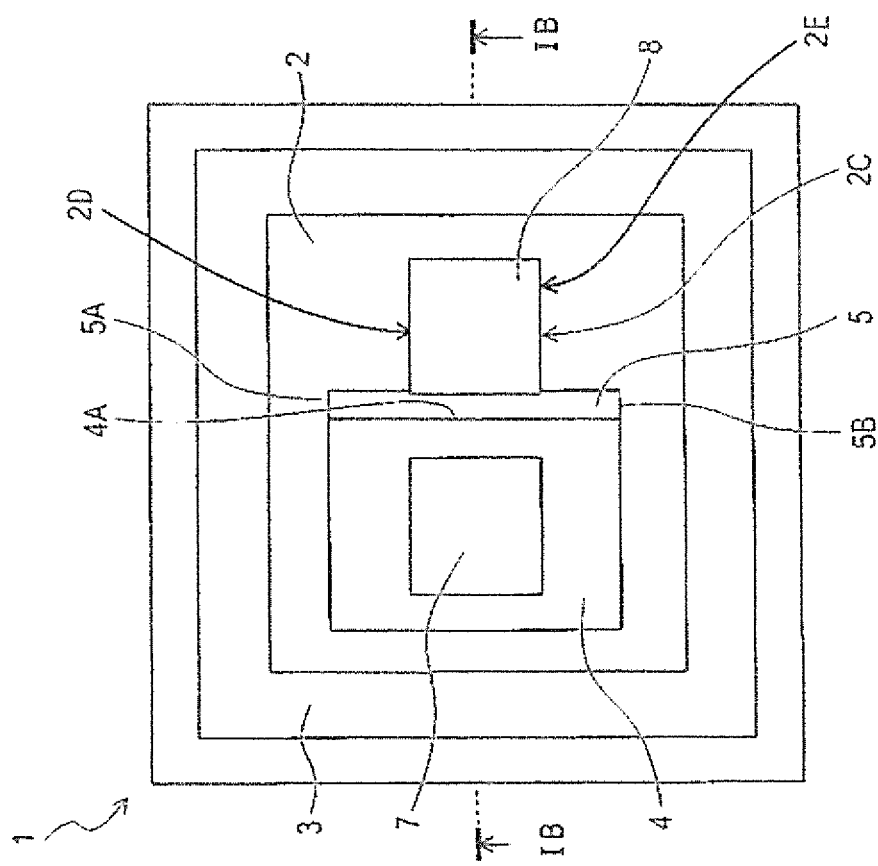
FIG. 1A is a schematic plan view of a wiring board according to a first embodiment of the present invention.

A wiring board 1 shown in FIGS. 1A and 1B has a base 2, a frame body 3, a pedestal (or a seating) 4, a groove 5, a first component 7 mounted on the wiring board 1 and a second component 8 mounted on the wiring board 1.

<Base>

The base 2 is a metal-made plate member having a front surface 2A and a back surface 2B. The base 2 functions as a heat radiation member for the first component 7 and the second component 8. The base 2 could be made of at least one of copper, copper alloy and copper complex in terms of heat transfer performance. As the copper alloy, it could be an alloy having copper as a main component and containing nickel, phosphorus, zinc, tin, aluminium etc. Here, the "main component" means a component whose rate is 90 mass % or more. As the copper complex, for instance, it is a complex formed by impregnating copper in porous material whose skeletal structure is formed by tungsten, or a complex having a multilayer structure formed by alternately stacking copper and molybdenum. Here, a heat sink having a heat radiation fin etc. could be joined to the back surface 2B of the base 2.

The base 2 has, on the front surface 2A thereof, a mounting area 2C where the second component 8 is supposed to be mounted. The mounting area 2C is an area that is identical with or corresponds to an outer edge of the second component 8 in plan view (i.e. when viewed from a direction perpendicular to the front surface 2A).

In the present embodiment, since the second component 8 is actually mounted on the mounting area 2C, the mounting area 2C completely overlaps the second component 8. The second component 8 is bonded to the mounting area 2C with, for instance, a brazing material, a solder or a resin adhesive.

Further, the mounting area 2C is provided at a position between the after-mentioned frame body 3 and the seating 4 in plan view. Furthermore, the mounting area 2C is located so as to be separate from the frame body 3 and also from the seating 4.

<Frame Body>

The frame body 3 is an insulating member that is bonded to a periphery of the front surface 2A of the base 2 through a bonding layer 3A. The frame body 3 is bonded to the base 2 so as to enclose the mounting area 2C and the seating 4 in plan view.

In the present embodiment, the frame body 3 is a layered body formed by stacking a plurality of insulating layers. The frame body 3 is provided with a wiring (not shown). This wiring includes wiring patterns arranged on a surface of the insulating layer, conductors penetrating the insulating layers, connecting pads configured to be electrically connected to the first and second components 7 and 8 when energization of the first and second components 7 and 8 is needed, and so on.

Material of the insulating layer of the frame body 3 is not especially limited, but it is preferable for the frame body 3 to be principally made of ceramic in terms of heat resistance. As the ceramic, it could be alumina, beryllia, aluminium nitride, boron nitrid, silicon nitride and glass. These ceramics can be used solely or used in combination with two or more ceramics combined together.

The bonding layer 3A is formed by solidification of a bonding material having fluidity. As a melting point of the bonding layer 3A, 300° C. or higher is preferable. As the bonding material forming the bonding layer 3A, it could be a brazing material, a solder and a resin adhesive. In terms of heat resistance, the brazing material or the solder is preferable. As the brazing material, for instance, it is a silver-based brazing material. As the solder, for instance, it is a gold tin solder.

<Seating>

The seating 4 is a metal-made portion provided in an area located inside the frame body 3 (or located at an inner side with respect to the frame body 3) on the front surface 2A of the base 2.

In the present embodiment, the seating 4 is formed integrally with the base 2. More specifically, the seating 4 is formed by protuberance of a part of the front surface 2A of the base 2. In other words, the seating 4 is a section where a thickness of the base 2 is thicker than other sections of the base 2.

The first component 7 is placed on the seating 4. The first component 7 is bonded to a surface of the seating 4 with, for instance, a brazing material, a solder or a resin adhesive. The seating 4 is located so as to be separate from the frame body 3.

<Groove>

The groove 5 is formed on the front surface 2A of the base 2. The groove 5 is a section where the thickness of the base 2 is thinner than other sections of the base 2.

The groove 5 is provided in at least an area between the mounting area 2C and the seating 4 on the front surface 2A of the base 2 in plan view. Further, the groove 5 extends in a direction (in an up-and-down direction in FIG. 1A) crossing an opposing direction (in a right-and-left direction in FIG. 1A) of the mounting area 2C and the seating 4.

More specifically, the groove 5 is arranged so as to overlap an outer edge 4A, which faces the mounting area 2C, of the seating 4 along the outer edge 4A in plan view. That is, the groove 5 extends parallel to the outer edge 4A while being contiguous to the outer edge 4A. In other words, one side surface of the groove 5 is flush with a side surface, which faces the second component 8, of the seating 4. Further, a part in a width direction (a right-and-left direction in FIG. 1A) of the groove 5 overlaps the mounting area 2C in plan view.

Furthermore, two end portions 5A and 5B of the groove 5 protrude toward the frame body 3 with respect to ends 2D and 2E of the mounting area 2C respectively in a direction (in an extending direction of the groove 5 in the present embodiment) that is perpendicular to the above opposing direction in plan view. That is, the groove 5 extends from one outer side of an area located between the mounting area 2C and the seating 4 to the other outer side that is opposite to the one outer side with respect to this area so as to pass through this area.

In this manner, the groove 5 is disposed in all the area located or sandwiched between the seating 4 and the mounting area 2C on the front surface 2A of the base 2 in plan view, and also disposed at the both outer sides of the area located or sandwiched between the seating 4 and the mounting area 2C in plan view.

As a depth of the groove 5, half of a thickness of the base 2 or less is preferable. If the depth of the groove 5 is too great, volume of the base 2 is decreased, then there is a risk of decreasing a heat radiation performance of the base 2 and decreasing a strength of the base 2.

In addition, as a width W of the part, overlapping the mounting area 2C, of the groove 5, one third of a length L of the mounting area 2C in the opposing direction of the mounting area 2C and the seating 4 or less is preferable. If the width W of the part overlapping the mounting area 2C is too large, there is a risk of decreasing a bonding performance of the second component 8 to the base 2. Further, when the second component 8 is mounted on the base 2, since a contact area between the second component 8 and the base 2 becomes small, there is a risk of decreasing a heat radiation performance of the second component 8.

<Component>

The first component 7 and the second component 8 are each a component that generates heat by its operation.

As the first component 7, it could be an LED (Light Emitting Diode) or an LD (Laser Diode). As the second component 8, it could be a light wavelength convertor having phosphor. With this combination, a wiring board for a light source such as a head lamp, a variety of lightings and a laser projector can be obtained.

The first component 7 and the second component 8 are directly bonded to the seating 4 and the base 2 respectively after the frame body 3 is bonded to the base 2 with the bonding layer 3A. As mentioned above, for energization of the first and second components 7 and 8, the first and second components 7 and 8 are each electrically connected to the connecting pad through the wire bonding.

1-2. Effect

According to the embodiment described above, the following effects can be obtained.

(1a) When bonding the frame body 3 to the base 2, the bonding material forming the bonding layer 3A flows into the groove 5 provided in the area between the mounting area 2C and the seating 4, thereby avoiding a fillet being formed at a root portion of the seating 4. It is therefore possible to suppress the forming of the fillet at the root portion of the seating 4 without decreasing a bonding area between the base 2 and the frame body 3.

(1b) The groove 5 is formed while being contiguous to the outer edge 4A, which faces the mounting area 2C, of the seating 4 in plan view, namely that the groove 5 is formed along the root portion of the seating 4. Since the groove 5 is provided at the root portion of the seating 4 which is a factor in the forming of the fillet, it is possible to surely avoid the fillet being formed. Further, an area where the fillet could be formed due to flow of the bonding material can be decreased at the root portion of the seating 4.

(1c) Since the two end portions 5A and 5B of the groove 5 protrude toward the frame body 3 with respect to the ends 2D and 2E of the mounting area 2C respectively in plan view, the bonding material can be readily guided to or flow into the groove 5. It is thus possible to surely avoid the bonding material reaching the root portion of the seating 4.

(1d) The seating 4 is formed integrally with the base 2. It is therefore possible to easily form the seating 4. Further, since heat can flow from the seating 4 to the base 2 without being interfered, it is possible to enhance the heat radiation performance of the first component 7 mounted on the seating 4.

2. Second Embodiment 2-1. Configuration

A wiring board 11 shown in FIGS. 2A and 2B has the base 2, the frame body 3, the pedestal (or the seating) 4, a groove 15, the first component 7 mounted on the wiring board 1 and the second component 8 mounted on the wiring board 1. Since the base 2, the frame body 3, the seating 4, the first component 7 and the second component 8 of the present embodiment are the same as those of the wiring board 1 of the first embodiment (FIG. 1A), these are denoted by the same reference signs, and their explanation will be omitted.

<Groove>

The groove 15 does not overlap the mounting area 2C in plan view (that is, the groove 15 is arranged so as to be separate from the mounting area 2C). Except for this point, the groove 15 is the same as the groove 5 of the first embodiment (FIG. 1A).

2-2. Effect

According to the embodiment described above, the following effects can be obtained.

(2a) Since the groove 15 is not provided in the mounting area 2C, a bonding area between the second component 8 and the base 2 becomes large. As a result, the bonding performance of the second component 8 to the base 2 is increased. Further, when the second component 8 is mounted on the base 2, it is possible to enhance the heat radiation performance of the second component 8.

Third Embodiment 3-1. Configuration

Figure 3:
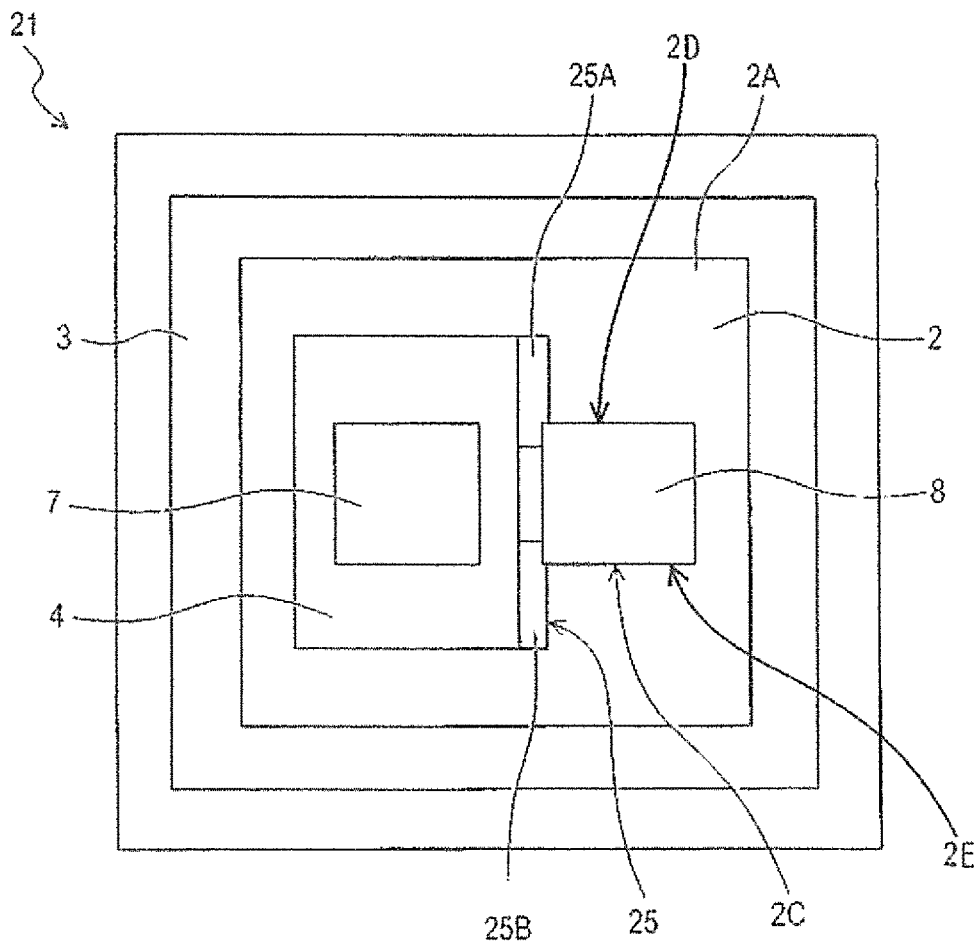
FIG. 3 is a schematic plan view of the wiring board according to a third embodiment of the present invention.
Figure 4:
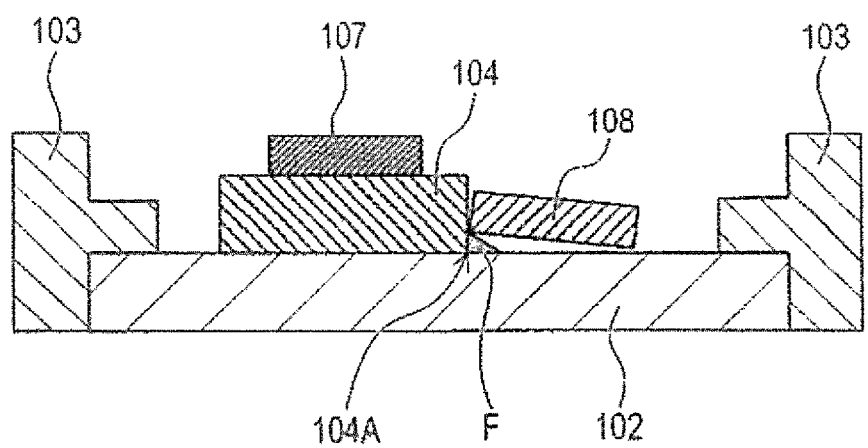
FIG. 4 is a schematic sectional view of the wiring board for explaining the problem raised in the present invention.

A wiring board 21 shown in FIG. 3 has the base 2, the frame body 3, the pedestal (or the seating) 4, a groove 25, the first component 7 mounted on the wiring board 1 and the second component 8 mounted on the wiring board 1. Since the base 2, the frame body 3, the seating 4, the first component 7 and the second component 8 of the present embodiment are the same as those of the wiring board 1 of the first embodiment (FIG. 1A), these are denoted by the same reference signs, and their explanation will be omitted.

<Groove>

The groove 25 is a groove obtained by removing a part of the groove 5 of the first embodiment (FIG. 1A) and dividing the remaining part into a first portion 25A and a second portion 25B.

That is, the groove 25 has the first portion 25A that extends from an area located between the mounting area 2C and the seating 4 toward the frame body 3 and the second portion 25B that extends from this area located between the mounting area 2C and the seating 4 toward the frame body 3 in an opposite direction to a direction in which the first portion 25A extends, on the front surface 2A of the base 2 in plan view.

The first portion 25A and the second portion 25B are arranged so as to be separate from each other in an extending direction of the groove 25. Outer end portions (each located close to the frame body 3) of the first portion 25A and the second portion 25B protrude toward the frame body 3 with respect to ends 2D and 2E of the mounting area 2C respectively in a direction that is perpendicular to an opposing direction of the mounting area 2C and the seating 4.

3-2. Effect

According to the embodiment described above, the following effects can be obtained.
(3a) Since the area located between the mounting area 2C and the seating 4 has a part where the groove 25 is not formed, it is possible to avoid the fillet being formed at the root portion of the seating 4 while maintaining or securing the bonding area between the second component 8 and the base 2.

4. Other Embodiments

Although the disclosure has been explained above by reference to certain embodiments, the disclosure is not limited to the embodiments described above, but includes a various modifications.
(4a) Each of the wiring boards 1, 11 and 21 could have a plurality of seatings 4. Further, the base 2 could have a plurality of mounting areas 2C.
(4b) In the wiring boards 1, 11 and 21 of the above embodiments, the groove could be provided in an area except the area located between the mounting area 2C and the seating 4 on the front surface 2A of the base 2. For instance, the groove could be provided so as to enclose the seating 4, or may be provided so as to enclose the mounting areas 2C. Further, the groove might be provided so as to enclose both of the seating 4 and the mounting areas 2C.
(4c) In the wiring boards 1, 11 and 21 of the above embodiments, the grooves 5, 15 and 25 do not necessarily overlap the outer edge 4A of the seating 4. Further, the grooves 5, 15 and 25 do not necessarily extend to the both outer sides of the area located or sandwiched between the seating 4 and the mounting area 2C. Moreover, the grooves 5, 15 and 25 are not necessarily formed along the outer edge 4A of the seating 4. Furthermore, each one end of the grooves 5, 15 and 25 could protrude toward the frame body 3 with respect to the outer edge 4A of the seating 4. That is, the grooves 5, 15 and 25 could extend to a position close to the frame body 3.
(4d) The seating 4 of each of the wiring boards 1, 11 and 21 is not necessarily formed integrally with the base 2. The seating 4 could be bonded to the base 2 with a bonding material. In a case where the seating 4 and the base 2 are prepared as different members then the seating 4 is bonded to the base 2, material of the seating 4 could be the same as that of the base 2 or might be different from that of the base 2. In a case where the material of the seating 4 is different from that of the base 2, it is preferable that the seating 4 be made of material that is superior in heat radiation performance, such as aluminium nitride, alumina, copper, copper alloy, copper complex, aluminum and iron-nickel alloy.
(4e) The wiring boards 1, 11 and 21 of the above embodiments could not have at least one of the first component 7 and the second component 8. That is, an idea of the present disclosure includes a wiring board before a part or all of the components that is supposed to be mounted is mounted.
(4f) Functions performed by one element or one component of the above embodiments could be performed by a plurality of elements or a plurality of components, and functions performed by a plurality of elements or a plurality of components could be performed by one element or one component. Further, a part of the configuration of the above embodiments could be omitted. Moreover, at least a part of the configuration of the above embodiment could be added to the configuration of the other embodiments, or might be replaced in the configuration of the other embodiments. All embodiments included in technical ideas that can be understood from contents recited in scope of claim are the embodiments of the present disclosure.

5. Embodiment

Test carried out to confirm the effect of the present disclosure and its evaluation will be explained below.

Embodiment 1

The frame body 3 was brazed to the base 2 (its average thickness is 500 μm) that is provided with the groove 5 shown in FIG. 1A. A measured thickness of the fillet formed at the root portion of the seating 4 due to the bonding material was 0 μm.

Comparative Example 1

The frame body 3 was brazed to the base 2 (its average thickness is the same as the above embodiment 1) that is not provided with the groove 5 shown in FIG. 1A. A measured thickness of the fillet formed at the root portion of the seating 4 due to the bonding material was 51 μm.
<Consideration>
The results of the embodiment 1 and the comparative example 1 confirmed that the forming of the fillet at the root portion of the seating 4 was able to be suppressed by the groove 5.

The entire contents of Japanese Patent Applications No. 2018-190122 filed on Oct. 5, 2018 and No. 2019-152452 filed on Aug. 23, 2019 are incorporated herein by reference.

Although the invention has been described above by reference to certain embodiments of the invention, the invention is not limited to the embodiments described above. Modifications and variations of the embodiment described above will occur to those skilled in the art in light of the above teachings. The scope of the invention is defined with reference to the following claims.

What is claimed is:
1. A wiring board comprising:
a metal-made base having a front surface and a back surface;
an insulating frame body bonded to the front surface of the base through a bonding layer made of bonding material;
a pedestal provided in an area that is located at an inner side with respect to the frame body, the pedestal extending upward from the front surface of the base, and the pedestal being a section where a thickness of the base is thicker than other sections of the base;
a mounting area provided on the front surface of the base, the mounting area configured to mount a component on the mounting area; and
a groove formed on the front surface of the base, the groove arranged in at least an area between the mounting area and the pedestal on the front surface in plan view and extending in a direction crossing an opposing direction of the mounting area and the pedestal.

2. The wiring board as claimed in claim 1, wherein:
the groove is formed while being contiguous to an outer edge, which faces the mounting area, of the pedestal in plan view.

3. The wiring board as claimed in claim 1, wherein:
the pedestal is formed integrally with the base.

4. The wiring board as claimed in claim 1, wherein:
at least one end portion of the groove protrudes toward the frame body with respect to one end of the mounting area in a direction perpendicular to the opposing direction in plan view.

5. The wiring board as claimed in claim 1, wherein:
a depth of the groove is half of a thickness of the base or less.

6. The wiring board as claimed in claim 1, wherein:
a width of a part, which overlaps the mounting area, of the groove is one third of a length of the mounting area in the opposing direction or less.

7. The wiring board as claimed in claim 1, wherein:
the frame body is principally made of ceramic.

8. The wiring board as claimed in claim 1, wherein:
the base is made of at least one of copper, copper alloy and copper complex.

9. The wiring board as claimed in claim 1, further comprising:
a component mounted on the mounting area.

* * * * *